United States Patent
Burgess et al.

(10) Patent No.: US 11,477,926 B2
(45) Date of Patent: Oct. 18, 2022

(54) ENHANCED 3D PRINTED SUPPORT BLOCK

(71) Applicant: JABIL INC., St. Petersburg, FL (US)

(72) Inventors: Darin Burgess, St. Petersburg, FL (US); Randy Crockett, St. Petersburg, FL (US); Timothy DeRosett, St. Petersburg, FL (US); Charles Santhakumar, St. Petersburg, FL (US); Scott Klimczak, St. Petersburg, FL (US); Anwar A. Mohammed, St. Petersburg, FL (US); Luke Rodgers, St. Petersburg, FL (US); Harpuneet Singh, St. Petersburg, FL (US); Daniel Torres, St. Petersburg, FL (US); Felipe Torres, St. Petersburg, FL (US)

(73) Assignee: JABIL INC., St. Petersburg, FL (US)

( * ) Notice: Subject to any disclaimer, the term of this patent is extended or adjusted under 35 U.S.C. 154(b) by 181 days.

(21) Appl. No.: 17/015,841

(22) Filed: Sep. 9, 2020

(65) Prior Publication Data

US 2022/0078955 A1 Mar. 10, 2022

(51) Int. Cl.
*H05K 3/30* (2006.01)
*H05K 13/00* (2006.01)
*B25B 11/00* (2006.01)
*B29C 64/364* (2017.01)
*B33Y 10/00* (2015.01)
*B33Y 80/00* (2015.01)

(52) U.S. Cl.
CPC ........ *H05K 13/0069* (2013.01); *B25B 11/002* (2013.01); *B25B 11/005* (2013.01); *B29C 64/364* (2017.08); *B33Y 10/00* (2014.12); *B33Y 80/00* (2014.12); *H05K 2203/0165* (2013.01)

(58) Field of Classification Search
CPC .... H05K 13/0069; B25B 11/00; B29C 64/364
See application file for complete search history.

(56) References Cited

U.S. PATENT DOCUMENTS

| 6,142,357 | A | 11/2000 | Howell |
| 6,257,564 | B1 * | 7/2001 | Avneri ................. B25B 11/005 269/21 |
| 2004/0172817 | A1 | 9/2004 | Gleason |
| 2006/0040521 | A1 | 2/2006 | Gordon et al. |
| 2012/0055355 | A1 | 3/2012 | Li et al. |
| 2013/0220570 | A1 | 8/2013 | Sears et al. |
| 2015/0231825 | A1 | 8/2015 | Swartz et al. |
| 2016/0009029 | A1 | 1/2016 | Cohen et al. |
| 2017/0239764 | A1 | 8/2017 | Mantani et al. |
| 2018/0126475 | A1 | 5/2018 | Mehkri et al. |

(Continued)

FOREIGN PATENT DOCUMENTS

WO    WO-2017040675 A1 *    3/2017    ................ B01L 1/02

*Primary Examiner* — Paul D Kim
(74) *Attorney, Agent, or Firm* — Shumaker, Loop & Kendrick, LLP; James D. Miller

(57) ABSTRACT

Support blocks for printed circuit boards (PCB's) and printed circuit board assemblies (PCBA's), wherein the support blocks are produced from a 3D printing process. The support block including a bottom surface having a vacuum connection; a top surface having at least one vacuum hole; at least one recessed surface that is offset from the top surface; and at least one vacuum channel extending from the vacuum connection to the at least one vacuum hole.

18 Claims, 13 Drawing Sheets

(56) References Cited

U.S. PATENT DOCUMENTS

| | | |
|---|---|---|
| 2018/0132392 A1 | 5/2018 | Mehkri et al. |
| 2018/0326665 A1 | 11/2018 | Gatenholm et al. |
| 2019/0351641 A1* | 11/2019 | Massey, Jr. ............ B62D 29/04 |
| 2019/0394914 A1 | 12/2019 | Rodgers et al. |

* cited by examiner

ENHANCED 3D PRINTED SUPPORT BLOCK

FIELD

The present disclosure relates to the field of 3D printed support blocks for screen printed circuit board assemblies, test fixtures, go-no-go fixtures, wave soldering pallets, and the like.

BACKGROUND

This section provides background information related to the present disclosure which is not necessarily prior art. A printed circuit board assembly (PCBA), comprises a printed circuit board (PCB) that contains electrically conductive traces to carry electrons from one location to another. These traces are typically made of copper and allow electrons to flow from one component to another. Components include integrated circuits, resistors, capacitors, diodes, and others. Surface mount technology (SMT) describes a method whereby electrical components are mounted directly onto a surface of a printed circuit board.

In the SMT process, screen printers can be used to deposit solder paste at defined locations on a PCB. Solder paste contains small amounts of conductive metal that is suspended in a flux material. The flux material temporarily allows components to adhere to a circuit board before a heated reflow step where heat is applied to melt the metal, thereby fusing the components to the circuit board. After solder paste is deposited onto a circuit board, components are placed on the wet solder paste and the combined PCB, wet solder paste, and component (now in position) are fused together in a reflow process. The reflow process heats the wet solder to melt the metal contained therein. This causes the components to be fused to the circuit board and ensures good contact between the PCB and the component(s). After the reflow step, the PCBA is cooled at a specified rate and the solder solidifies, thereby attaching the components to the PCBA.

Screen printers place stencils on PCBs and PCBAs. The stencils have apertures where solder paste will be deposited. Solder paste is thickly spread out on the stencil at a first side and then a squeegee is used to evenly spread the solder paste across the stencil. Solder paste fills the apertures (holes) in the stencil and is deposited onto the PCB (or PCBA) that is located underneath the stencil. After the squeegee has spread the solder paste across the PCB (or PCBA), the stencil is separated from the PCB (or PCBA), leaving a PCB (or PCBA) with wet solder paste at specific locations. Components are then attached at these specific locations.

The squeegee exerts a downward force on the circuit board as it spreads solder paste across it. Therefore, to avoid bending the circuit board and to avoid uneven solder paste thickness, the circuit board is supported from underneath. For a circuit board with a flat bottom surface, a flat support can be used. However, for circuit boards with components on both sides, a flat support does not work because of the presence of the components. The components on the bottom side of the circuit board could be damaged from being compressed between a flat support and the circuit board. Additionally, a top of the board would likely be uneven when components are present on the bottom of the board and the support is flat. For circuit boards with components on both sides, pins of varying height or specialized support blocks (also referred to as plates or pallets) are commonly used. Specialized support blocks typically include two pieces: a top block and a bottom block. The material of construction for the support blocks is typically aluminum. Instead of being flat, the top block has cut-outs to allow components from the bottom side of a PCBA to be received therein. A bottom block is attached underneath the top block so that the outer edges of the top and bottom blocks are tightly sealed. The bottom block typically has an opening for attaching a vacuum source. When a PCBA is on top of the top block, vacuum is pulled through the opening in the bottom block to secure the PCBA to the top block. The vacuum pressure is removed prior to removing the PCBA.

While the aforementioned support blocks have been useful in screen printing processes, they do not provide optimal surface flatness. This problem is compounded by the two-block design because there is a dimensional tolerance (variation) for each block and the total dimensional tolerance (variation) for the combined support block is the sum of each of the individual tolerances. Today's support blocks are expensive and are often required to be produced off-site and shipped to a PCBA assembly site. The support blocks are often manufactured by subtractive manufacturing, such as CNC machining. In subtractive manufacturing processes, material is removed from a starting piece of solid material to achieve the desired shape. Therefore, when producing PCBA support blocks by subtractive manufacturing, as the number of components on a PCBA increases, the machine time and cost to produce a PCBA support block increases. Further, today's aluminum support blocks are heavy. This results in higher shipping costs and potential ergonomic issues and even injury for workers that are lifting them. Today's PCBA support blocks are also inefficient in the way that the vacuum is applied.

For at least these reasons, there is a need in the art for an improved PCBA support block.

Three-dimensional (3D) printing is any of various processes in which material is joined or solidified under computer control to create a three-dimensional object. The 3D print material is "added" onto a base, such as in the form of added liquid molecules or layers of powder grain or melted feed material, and upon successive fusion of the print material to the base, the 3D object is formed. 3D printing is thus a subset of additive manufacturing (AM).

A 3D printed object may be of almost any shape or geometry, and typically the computer control that oversees the creation of the 3D object executes from a digital data model or similar additive manufacturing file (AMF) file, i.e., a "print plan". Usually this AMF is executed on a layer-by-layer basis, and may include control of other hardware used to form the layers, such as lasers or heat sources. A part for production is, virtually-speaking, "sliced" into layers in the print plan, as discussed throughout, and these virtual layers then become actual layers.

There are many different technologies that are used to execute the AMF. Exemplary technologies may include: fused deposition modeling (FDM); stereolithography (SLA); digital light processing (DLP); selective laser sintering (SLS); selective laser melting (SLM); high speed sintering (HSS); inkjet print and/or particle jetting manufacturing (IPM); laminated object manufacturing (LOM); electronic beam melting (EBM); and direct energy deposition (DED).

Some of the foregoing methods melt or soften the print material to produce the print layers. For example, in FDM, the 3D object is produced by extruding small beads or streams of material which harden to form layers. A filament of thermoplastic, wire, or other material is fed into an extrusion nozzle head, which typically heats the material and turns the flow on and off.

Other methods, such as laser or similar beam-based or sintering techniques, may heat or otherwise activate the print material, such as a print powder, for the purpose of fusing the powder granules into layers. For example, such methods may melt the powder using a high-energy laser to create fully dense materials that may have mechanical properties similar to those of conventional manufacturing methods. SLS, for example, uses a laser to solidify and bond grains of polymer, metals, or composite materials into layers to produce the 3D object. The laser traces the pattern of each layer slice into the bed of powder, the bed then lowers, and another layer is traced and bonded on top of the previous.

In contrast, other similar methods, such as IPM, may create the 3D object one layer at a time by spreading a layer of powder, and printing a binder in the cross-section of the 3D object. This binder may be printed using an inkjet-like process.

By way of further example, and as will be appreciated by the skilled artisan, high speed sintering (HSS) employs part formation through the use of heating lamps, such as infrared (IR) lamps. More specifically, a part for production is, virtually-speaking, "sliced" into layers in the print plan, as discussed throughout, and these virtual layers then become actual layers upon application of the IR by the print process to the treated areas of a print bed.

That is, HSS typically occurs using a "bed" of powdered print material. The print plan may select one or more locations within the powder bed that will serve as part generation locations. Each part layer is "printed" onto the part generation pattern in the powder bed using a heat-absorbing ink. In a typical process, a broadband IR lamp then delivers heat across the entire print bed. This heat is absorbed by the heat absorbing ink, thereby forming a part layer having only those shaped characteristics indicated by the pattern of the ink placed upon the powder bed, as referenced above.

The foregoing process then repeats, layer by layer, until the completed part is formed. The HSS process accordingly allows for highly refined designs that may allow for internal movement and similar interactions, even between internal aspects of a given part. Moreover, to allow for such refined patterning, an anti-heat agent, such as water, may also be placed at selected locations about the print boundaries for a given layer pattern, so as to prevent undesired absorption of heat by those layers and a consequent malformation of the part.

In accordance with the foregoing, part characteristics in HSS may be varied layer by layer, or even within layers, such as based on the inks used and/or the level of heat applied. Yet further, an entire bed may be used to create individual layer patterns for many parts with each single pass of the IR lamp across the print powder bed.

SUMMARY OF THE INVENTION

The disclosed exemplary apparatuses, systems, and methods provide a 3D printed support that can be utilized in a screen-printing process to achieve a more uniform application of solder paste on a printed circuit board or printed circuit board assembly (PCB or PCBA). Certain embodiments relate to a 3D printed PCBA support block that is lighter (in weight), has better (smaller) dimensional tolerances, enhanced flatness, has a more targeted vacuum system, and that has a single piece design.

In one embodiment, the 3D printed support block comprises a bottom surface having a vacuum connection; a top surface having at least one vacuum hole; at least one recessed surface that is offset from the top surface; and at least one vacuum channel extending from the vacuum connection to the at least one vacuum hole. The support block can be provided for screen printed circuit board assemblies, test fixtures, go-no-go fixtures, wave soldering pallets, and the like, for example.

In a method of producing a 3D printed support block, the method comprises 3D printing a support block, wherein the support block comprises: a bottom surface having a vacuum connection; a top surface having at least one vacuum hole; at least one recessed surface that is offset from the top surface; and at least one vacuum channel extending from the vacuum connection to the at least one vacuum hole.

A screen printer for screen printing on an article such as a printed circuit board or a printed circuit board assembly is also disclosed according to an embodiment of the present invention. The screen printer includes a lift plate, a vacuum block disposed on the lift plate, at least one support bar removably disposed on the lift plate, and a 3D printed support block having a bottom surface resting on both the vacuum plate and the at least one support bar and a top surface configured to support the article during the screen printing.

BRIEF DESCRIPTION OF THE DRAWINGS

The disclosed non-limiting embodiments are discussed in relation to the drawings appended hereto and forming part hereof, wherein like numerals indicate like elements, and in which.

DETAILED DESCRIPTION

Figure 1:
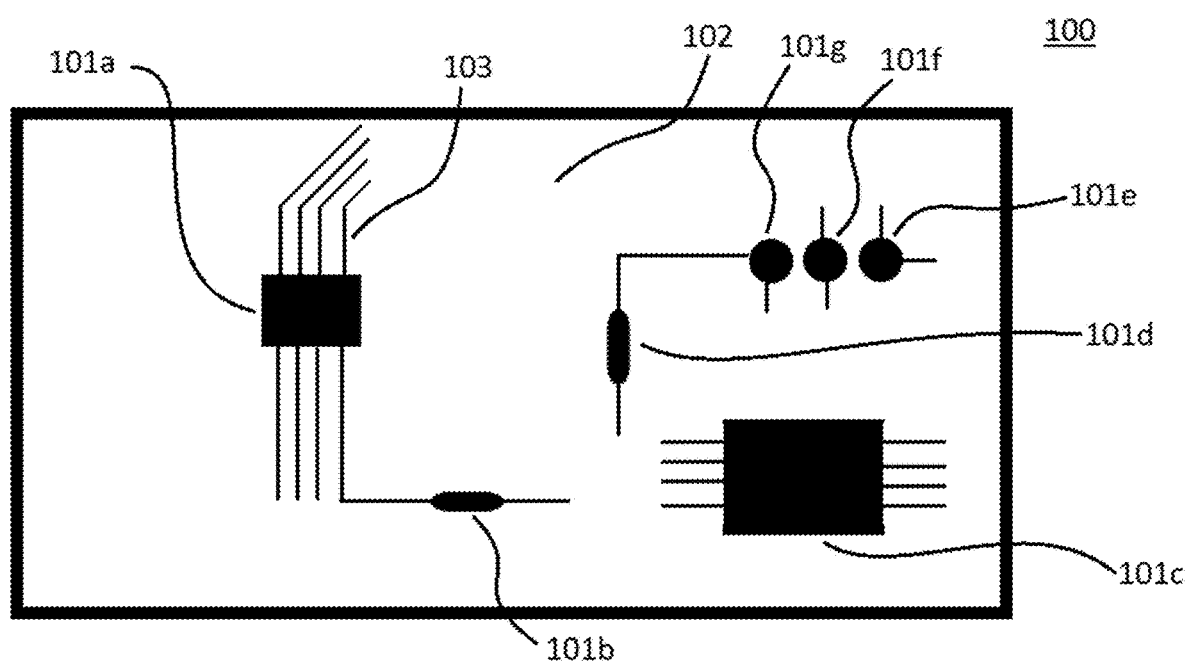
FIG. 1 is a schematic diagram of a printed circuit board assembly according to prior art.

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical FIG. 1 shows a printed circuit board assembly (PCBA) 100. The PCBA 100 contains components, represented in FIG. 1 as 101a, b, c, d, e, f, and g, that are attached to a printed circuit board (PCB) 102. Traces 103 are used to carry electrons from one location to another. The components 101a, b, c, d, e, f, and g are three dimensional and extend from the PCB.

Figure 2:
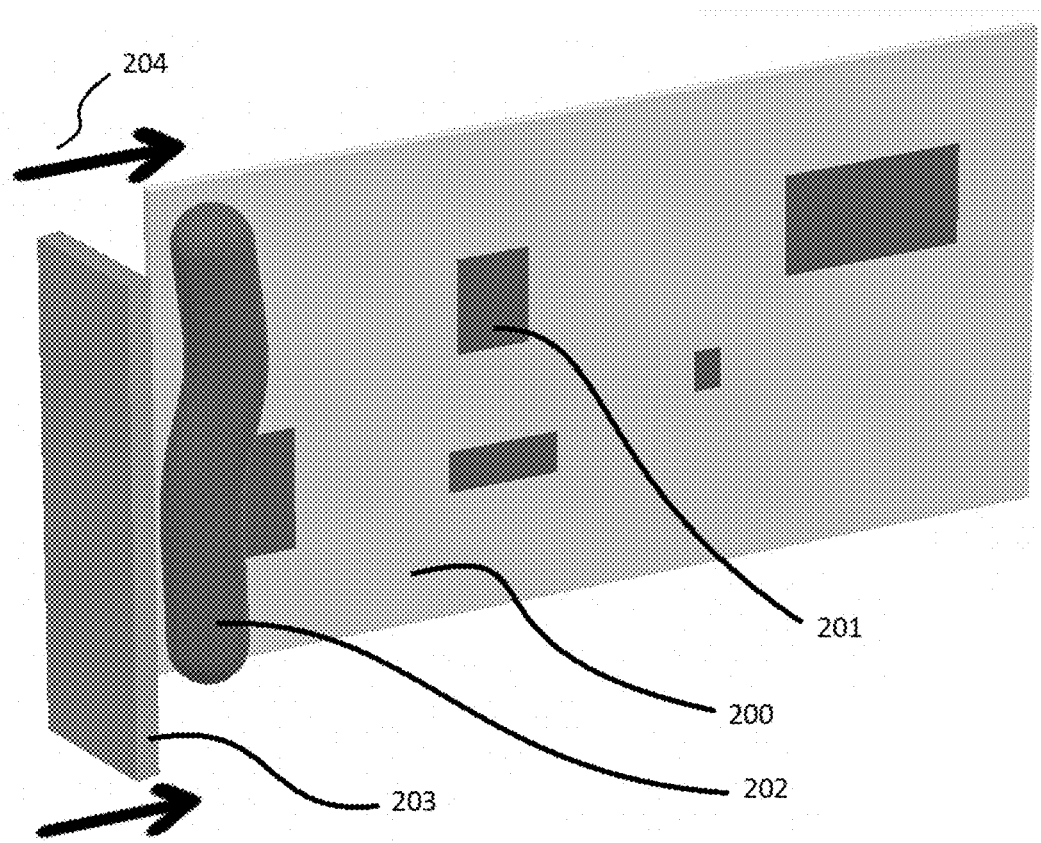
FIG. 2 is a schematic diagram of a screen printing apparatus according to prior art.

FIG. 2 shows an apparatus that is commonly used to screen print solder paste onto the PCB 102. A stencil 200 contains apertures 201 (and other apertures as shown by squares and rectangles in FIG. 2) that are cut out from the stencil 200. The PCB 102 (not shown in FIG. 2) is located directly underneath the stencil so that solder paste 202 that is deposited into the apertures 201 is deposited onto a surface of the PCB 102 at defined locations. The solder paste 202 is deposited on the stencil 200 and a squeegee 203 moves in a direction of arrows 204 to evenly spread the solder paste 202 across the stencil 200 and into the apertures 201. After the solder paste 202 is evenly spread across the stencil 200, the stencil 200 is separated from the PCB. At this point, the PCB has wet solder paste at the proper locations and is ready for components to be placed onto it, commonly by a pick and place machine.

Figure 3:
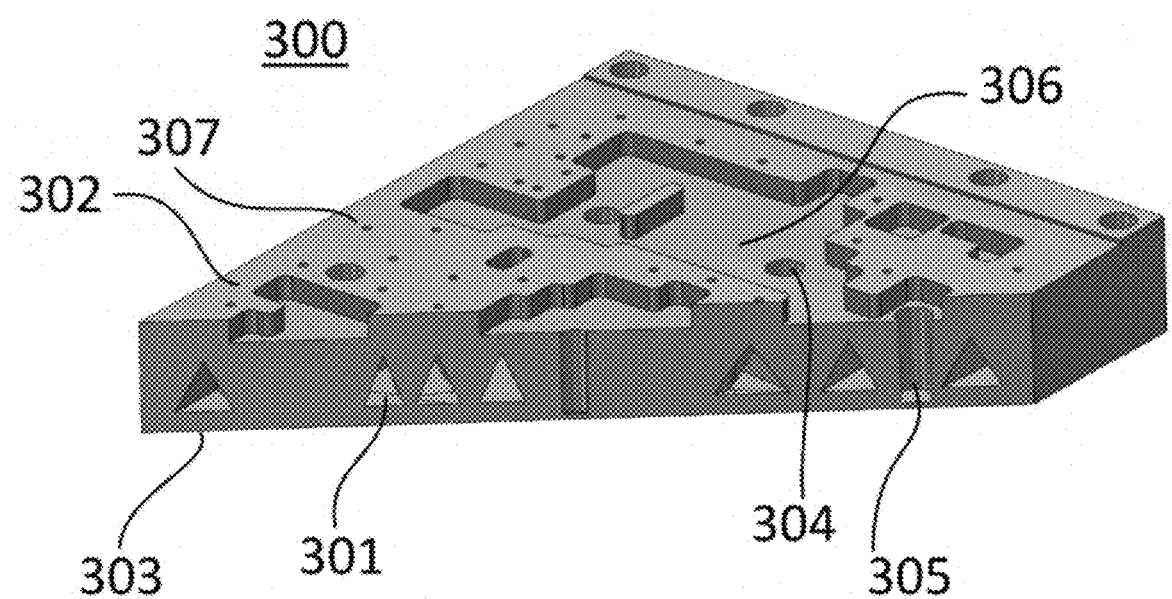
FIG. 3 is a schematic perspective view of a support block according an embodiment of the invention.

FIG. 3 shows a support block 300 according to an embodiment of the invention. The support block 300 shown is 3D printed by an additive manufacturing process and can have a single piece design as shown in FIG. 3. A single piece design is beneficial because it minimizes a dimensional tolerance of the support block 300 and optimizes a flatness thereof. In a two-block design, a bottom block has a dimensional tolerance and a top block has a dimensional tolerance. The total dimensional tolerance for a two block support system is thus equal to a sum of the dimensional tolerance of the bottom block and the dimensional tolerance of the top block. For a single piece design, on the other hand, there is only one dimensional tolerance. Because there is a single tolerance, the single piece design of the instant invention allows a flatness of the support block 300 to be more easily achieved, specifically on a top surface 302 of the support block 300 that holds the PCBA (or PCB). Although the PCB is described herein as an example, it is understood that the support block can be provided for other systems such as test fixtures, go-no-go fixtures, wave soldering pallets, and the like, for example. Triangular supports 301 formed in the support block 300 efficiently transfer downward pressure (for example, from a squeegee) that is exerted on the top surface 302 of the support block 300 directly to a bottom surface 303 of the support block 300. The triangular supports 301 may also function as vacuum channels discussed in more detail hereinbelow. The support block 300 as shown is an advantage over prior art support block systems, such as aluminum systems, where a z-strength (strength in an up and down direction) is a function of a strength and a thickness of the top surface of the support block (for example, when the top, horizontally oriented surface is not supported from underneath). FIG. 3 also shows magnet openings 304, magnet channels 305, and recessed areas 306. In an embodiment, the magnet openings 304 and the magnet channels 305 configured to receive magnets (not shown) therein. The magnets can have a desirable shape such as spherical, puck-shaped, cylindrical, or other shapes. A shape of the magnet channels 305 may be selected to match the shape of the magnets that are used. For example, a circular shaped magnet channel may be provided for a spherically shaped magnet, a square shaped magnet channel may be provided for a cube or a square shaped magnet, and the like. In an embodiment, the recessed areas 306 are configured so that the components of the PCBA fit within the recessed areas 306. In an embodiment, vacuum holes 307 (and associated vacuum channels formed within the support block 300) are provided to aid with securing the PCB or the PCBA to the support block 300.

The 3D printed support block 300 according to the invention enables a more efficient use of vacuum suction used during the manufacturing process. Because of the single piece design and the ability to create the vacuum channels with specific geometries for optimal vacuum at specific locations, the 3D printed support block 300 allows a vacuum to be applied only at specific locations where it is needed. Because of unique geometries that are made possible by 3D printing, the vacuum channels can be included in the 3D printed support block 300 that provide the vacuum at the specific locations. This is a more efficient vacuum process because a volume that has to be evacuated (by suction) to reach a desired vacuum pressure is minimized.

Figure 4:
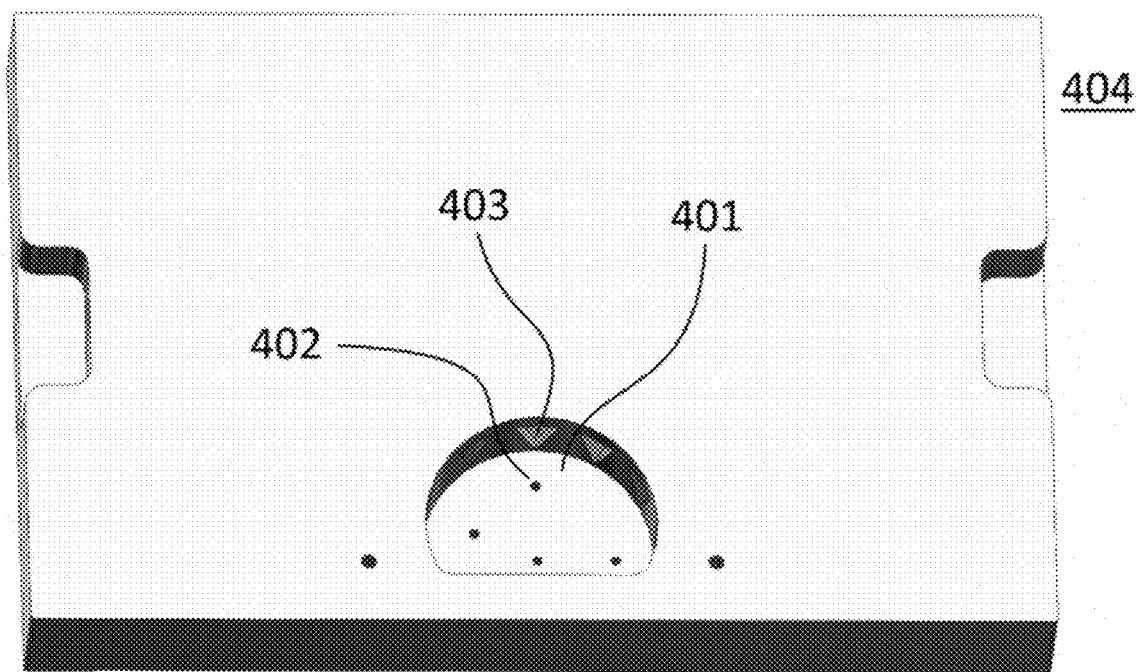
FIG. 4 is a schematic perspective view of a support black having a vacuum connection according to an embodiment of the invention.

FIG. 4 shows an embodiment of the invention having a vacuum connection 401 formed in a support block 404. A vacuum source (not shown), for example, a vacuum hose or duct, can connect to the vacuum connection 401 to pull a vacuum on the vacuum holes 402 and on vacuum channels 403 formed within the support block 404. There may be a number of vacuum holes 402 and vacuum channels 403 formed within the support block 404, as desired. In FIG. 4, the vacuum holes 402 are formed in the vacuum connection 401. The vacuum holes 402 may be located on a top surface of support block 404, or elsewhere, as desired. The vacuum channels 403 shown are disposed around a perimeter of the vacuum connection 401, but can be formed elsewhere, as desired. The vacuum channels 403 shown are enclosed channels that lead to specific locations on a top surface of support block 404. It is understood the vacuum channels 403 may have other configurations without departing from the scope of the invention.

Figure 5:
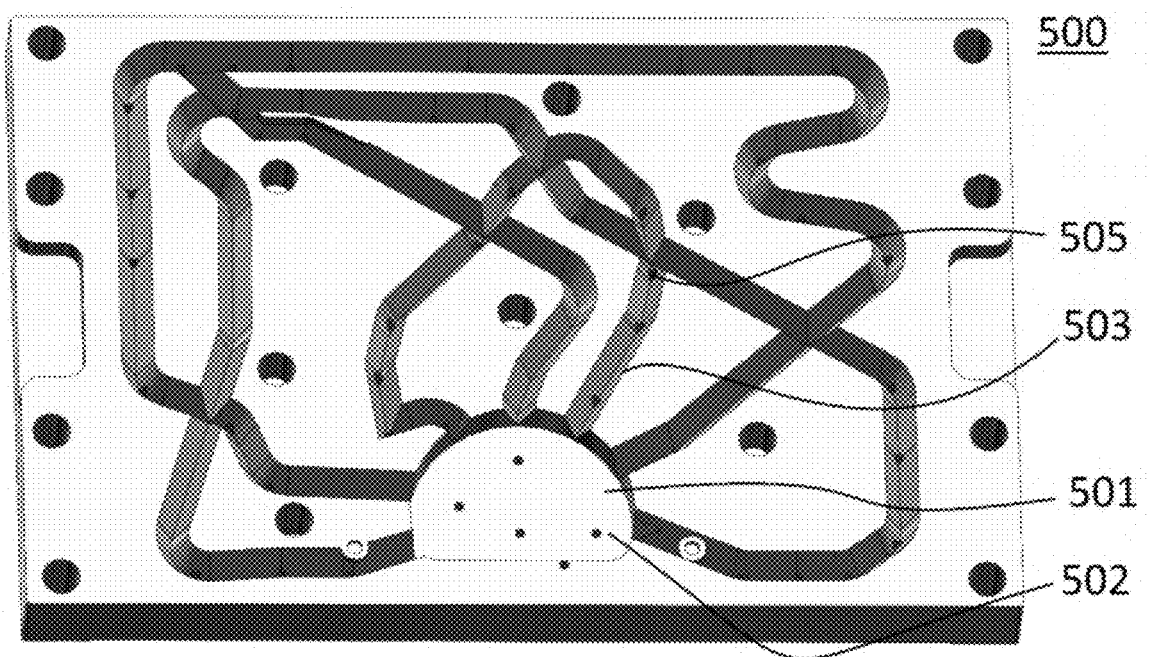
FIG. 5 is a schematic perspective view of a support block with a portion thereof cut away to show a vacuum distribution system according to an embodiment of the invention.

FIG. 5 shows a cut-away view of a support block 500 according to an embodiment of the invention. FIG. 5 shows a cut-away view to better visualize a vacuum distribution system. A vacuum connection 501 provides a connection point for connecting a vacuum source to a support block 500. The vacuum connection 501 may be 3D printed with a specific shape that allows a given vacuum duct or vacuum hose to easily connect to it (from the bottom side in FIG. 5). Vacuum holes 502 are located in a top surface of the support block 500. Vacuum is applied to the vacuum connection 501 and pulls a vacuum through the vacuum holes 502. Additionally, vacuum channels 503 connect the vacuum connection 501 to distributed vacuum locations 505 to provide vacuum at the distributed vacuum locations 505. Because the vacuum connection 501 is fluidly connected to each of the distributed vacuum locations 505 (shown as holes on top of vacuum channels 503), applying a vacuum to vacuum connection 501 results in a vacuum applied at each of the distributed vacuum locations 505. In this way, a PCB or PCBA may be held in place by a distributed vacuum system while minimizing a volume that must be evacuated (placed under vacuum). The support block 500 may include any number of the vacuum holes 502, the vacuum channels 503, and the distributed vacuum, locations 505 as desired. The support block 500 may include one or more of the vacuum channels 503. The vacuum channels 503 may support the top side of the support block 500 by providing a rigid structure that directly connects to the top surface of the support block 500 and directly connects to a bottom surface of the support block 500. In this way, the vacuum channels 503 may serve both as vacuum distribution channels, as well as structural supports.

When using a subtractive manufacturing process, such as CNC machining, an amount of wasted material increases as an amount of open area is increased. More open area is required as the number of components on a PCBA increases. Therefore, the machining time to manufacture a support block for a PCBA with a large number of components is longer than the machining time to make a support for a PCBA with a small number of components, when using a subtractive manufacturing process. When using an additive manufacturing process, such as 3D printing (e.g. fused filament fabrication (FFF) printing and others), the amount of material that is used to make a support block and the machine time that is required to produce a support block are inversely related to the number of components on a PCBA board. In other words, a 3D printed PCBA support block for a PCBA with a high number of components requires less material and is faster to manufacture, compared to a support block designed for a PCBA with a fewer number of components. As PCBA's contain more and more components, 3D printed support blocks become more and more attractive.

3D printed PCBA support blocks can also be lighter in weight than standard aluminum support blocks. 3D printed support blocks (produced by fused filament fabrication (FFF)) do not have solid cores. Instead 3D printed (using FFF) support blocks fill void areas with infill, which is a repetitive structure that partially fills void spaces and provides structure to a 3D printed object. For example, a 3D printed support block, such as the support block 600 shown in FIG. 6, may be produced with 20% infill (i.e. 20% infill density) to result in a support block that is much lighter than an aluminum support block. Infill density may be 20% percent by volume. Infill amount may be varied to achieve a desired strength and/or weight. By using polymer/composite materials and by using an infill that is less than 100%, the weight of a PCB/PCBA support block is significantly reduced. For example, aluminum machined blocks can weigh 10 pounds or more, while 3D printed blocks with 20% infill can weigh less than 2 lbs. This results in better ergonomics, reduced risk of personal injury when handling, and lower shipping costs. 3D printed support blocks with reduced weight are also easier to position in a screen printer and are easier for operators to handle when changing support blocks. It is understood that any screen printer may be used such as an MPM brand or DEK brand screen printer without departing from the scope of the invention.

In addition to selecting 3D-printable materials for weight consideration, a material may also be selective for other characteristics. For example, electrostatic-discharge protected, polyethylene terephthalate glycol (PETG-ESD) is a desirable material because it will not corrode and it is dissipative, unlike aluminum which is conductive. A carbon filled nylon may be used to 3D print a PCBA support block that has a high Young's Modulus (a stiff support block). ESD-safe acrylonitrile butadiene styrene (ABS ESD), ESD-safe polycarbonate/acrylonitrile butadiene styrene (PC-ABS ESD), and/or ESD-safe polycarbonate may also be used to manufacture 3D-printed PCBA support blocks.

Further, multiple materials may be used to manufacture a 3D printed support block. For example, a first material may be used to 3D print the majority of a PCBA support block and a second material may be used to create circumferential seals around the vacuum holes to improve vacuum seal to a PCBA or PCB. In this example, the first material may be PETG-ESD and the second material may be a thermoplastic elastomer such as styrene-ethylene-butylene-styrene (SEBS) (to improve the vacuum seal to the PCBA or PCB and/or to provide cushion between a PCBA or PCB and the support block). Additionally, a second material may be used to create the vacuum channels. For example, a material that has a low gas permeability may be selected and used to create the vacuum channels to achieve a better (lower pressure) vacuum. These multiple materials are easily used in the 3D printing process.

In another embodiment, a first material may be used to 3D print the majority of a PCBA support block and a second material may be used for the top surface of the support block. In this example, the first material may be PETG-ESD and the second material may be a thermoplastic elastomer such as styrene-ethylene-butylene-styrene (SEBS) (to improve the vacuum seal to the PCBA or PCB and/or to provide cushion between a PCBA or PCB and the support block).

Multiple materials may also be used to print a support block having a base that is printed using a rigid/stiff material and an upper layer or layers that is/are printed using an elastomeric material In this example, the elastomeric material could provide a cushion for the PCBA, or provide "suction features" to better hold the PCBA when the vacuum is applied. An elastomeric material can be added around the perimeter of vacuum holes in embodiments. An elastomeric material can be used to construct the top surface of a 3D printed support block in embodiments.

Further, a multiple-material print may provide a 3D printed support block that comprises a top and bottom layer that are made of a material that is selected for its ability to achieve good flatness while the middle layer of the 3D printed support is made of a material that is selected for another property (for example: cost, strength, weight, density, etc.).

Figure 6:
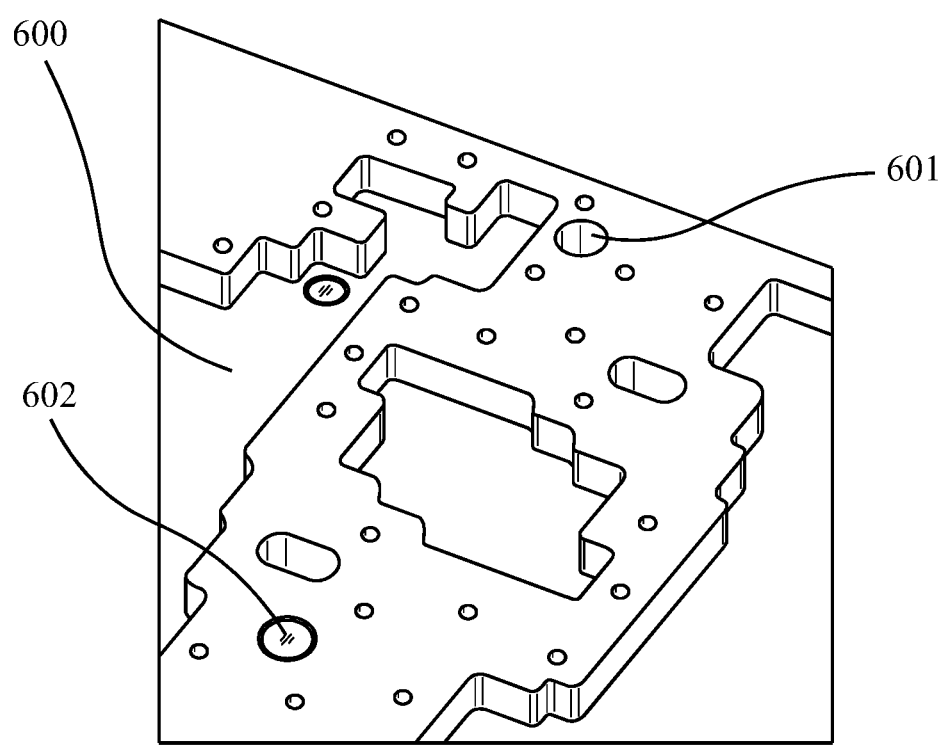
FIG. 6 is a schematic perspective view of a support block according to an embodiment of the invention.

The flatness of 3D-printed support blocks can be even further improved using magnets. As shown in FIG. 6, a 3D-printed support block 600 can be manufactured with magnet holder locations 601. Magnets 602 can be inserted into the magnet holder locations 601 for improved support block flatness. The magnets 602 may be press fit into the magnet holder locations 601. That is, the magnets 602 may fit tightly within the magnet holder locations 601 to hold the magnets 602 in the magnet holder locations 601. The magnets 602 may be magnetically attracted to a metal surface that is located underneath the 3D-printed support block 600. Because the 3D-printed PCBA support block 600 has some flexibility, the magnets can bend/flex the 3D printed PCBA support block 600 to improve flatness. Very stiff PCBA support blocks, such as those made from aluminum, do not have the flexibility required for magnets to bend them.

Figure 7:
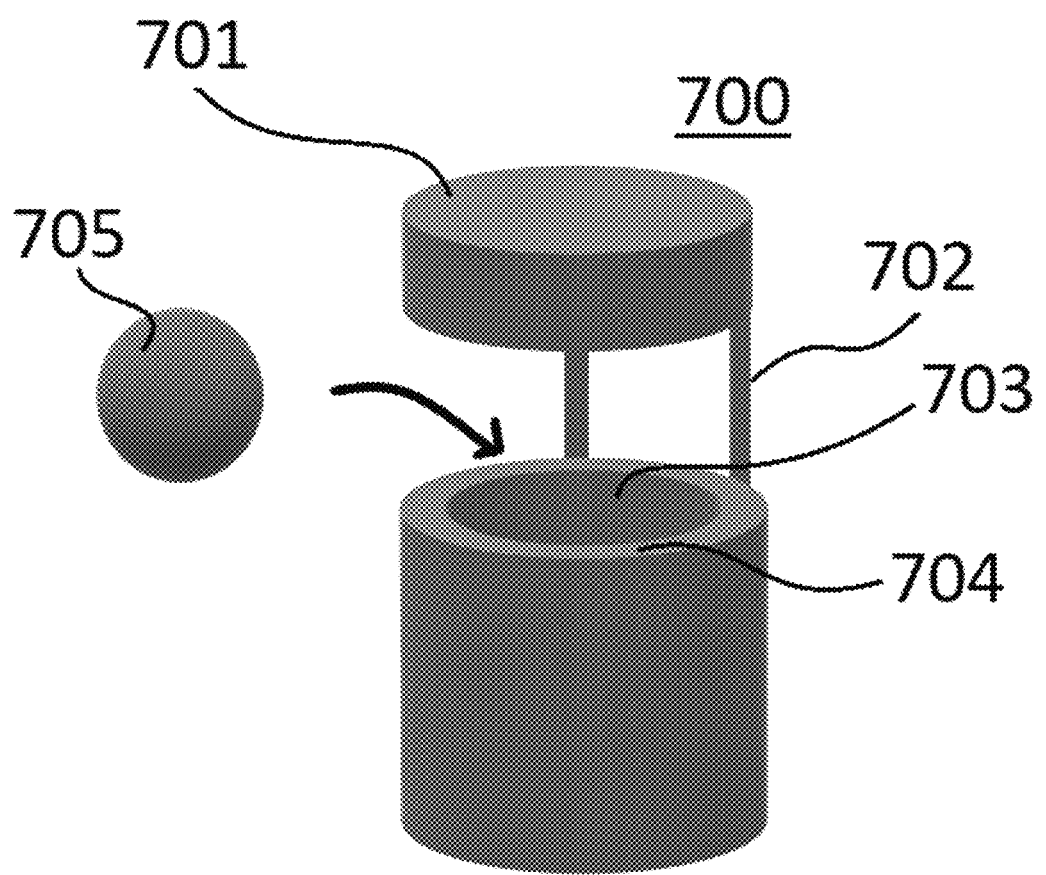
FIG. 7 is an exploded perspective view of a 3D printed insert holder and a magnet according to an embodiment of the invention.

FIG. 7 shows a 3D printed insert holder that may be included in various embodiments. For example, an insert holder 700 may be 3D printed as an integral part of a 3D printed support block. The insert holder 700 includes a roof 701 and at least one support stand 702. The support stand 702 may be a column or strand of material to maintain the roof 701 in a desired orientation or location. A magnet channel 703 is defined by outer perimeter 704. A magnet 705 can be positioned or slid under the roof 701 and into the magnet channel 703 where it falls downward within the magnet channel 703. Positioning of the magnet 705 is indicated by an arrow in FIG. 7. As shown in FIG. 7, the 3D printed insert holder 700 (specifically, the roof 701) prevents the magnet 705 from falling out of a support block when the support block is oriented upside down (with the top opening of magnet channel 703 facing towards the Earth's surface).

Figure 8:
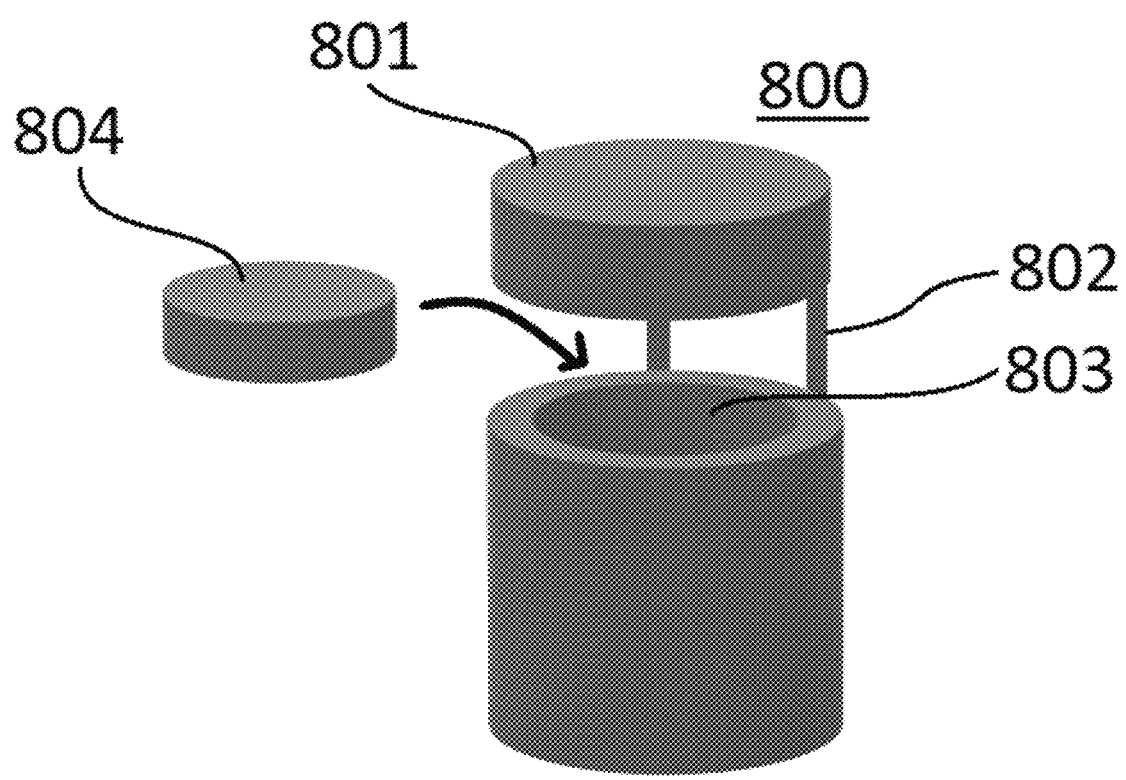
FIG. 8 is an exploded perspective view of a 3D printed insert holder and a magnet according to another embodiment of the invention.

FIG. 8 shows a 3D printed insert holder 800 that is designed for puck-shaped magnets. The insert holder 800 includes a roof 801, at least one support stand 802, and a magnet channel 803. A distance between roof 801 and a top of the magnet channel 803 may be selected so a magnet 804 can narrowly slide between the roof 801 and the top of the magnet channel 803, thereby minimizing a profile of the insert holder 800. Positioning of the magnet 804 is indicated by an arrow in FIG. 8. As shown in FIGS. 7 and 8, 3D printed insert holders may be designed to accommodate magnets of varying shapes and sizes.

When recycling support blocks, it may be desirable to remove the magnets prior to recycling. Advantageously, the insert holders of FIGS. 7 and 8 may be designed so that the roof and/or stands can be snapped off (removed from) the support block to create an unrestricted opening for the magnets to fall out of when the support block is inverted (turned upside down). After removing the insert holder(s) (i.e. removing the roof(s) and/or stand(s)), support blocks can simply be turned upside down to cause magnets to fall out of (away from) the support block. The magnets can be reused and the magnet-free support blocks can be recycled.

In another embodiment, an improved PCBA support block may comprise a 3D printed support block (having openings for PCBA components to fit into) that is attached on top of a flat metal block. The 3D printed support block may be attached to the flat metal block using bolts or other suitable fasteners (such as screws, clamps, magnets, ties, adhesive, etc.). This design allows custom detail to be achieved via 3D printing and allows improved flatness by bolting the 3D printed portion to a flat, metal (or other stiff material), bottom block. Further, this design allows a shorter 3D printed support block to be combined with a second piece to form a support block that can be used with tall support block geometries. In other embodiments, parallel support blocks may be used in conjunction with a 3D printed support block. The parallel support blocks can be placed underneath the 3D printed support block in a screen printer. The size of the 3D printed support block would determine the number of parallel support blocks to be used. The parallel support blocks would have a metal top surface so that magnets could be used to attach the 3D printed support block to the top surface of the parallel support blocks.

Polymeric, 3D printed support blocks also reduce the risk of scratching the PCBA's that they are supporting, compared to aluminum support blocks.

3D printed PCBA support blocks facilitate the use of embedded bar codes for error-proofing and/or inventory control. A 3D printed bar code can easily be added directly on a PCBA support block as the block is being produced. Alternatively, an RFID tag could be inserted inside the 3D printed PCBA support block, during the 3D printing process, to eliminate the risk of losing the tag and to add remote traceability features.

3D printed PCBA support blocks simplify logistics and are recyclable. 3D printed PCBA support blocks may be manufactured at the PCBA assembly site that uses them instead of manufacturing PCBA frames off-site and shipping them to the point of use. Unlike CNC machining, which uses cutting oils and produces metal chips, most 3D printing techniques are inherently clean, which allows 3D printing to take place next to a PCBA production line. For example, 3D printing may proceed in an ISO1, ISO2, ISO3, ISO4, IS05, ISO6, ISO7, ISO8, or ISO9 class clean room, as defined by ISO 14644-1 Cleanroom Standards. This would greatly reduce the time between support frame design and support frame use. Recyclable polymers may be used to manufacture PCBA support blocks. This would allow previously used support blocks to be melted, reprinted (3D printed), and used again. Because PCBA support blocks are custom designed for a given PCBA, there would be a significant time and material savings by 3D printing PCBA support blocks at the site where PCBA's are assembled. An even greater savings could be realized by recycling previously used 3D printed PCBA support blocks (either at a separate location or at the PCBA assembly site). When recycling previously used 3D printed support blocks, previously used 3D printed support blocks may be used as feedstock for 3D printing new support blocks.

Another advantage of 3D printing support blocks is the ability to adjust the print speed (production rate) based on the end user's requirements. For example, when a PCBA has fine-pitch components, tighter tolerances (flatness) are required for the support block. In this case, slower 3D print speeds could be used for optimal print quality. On the other hand, PCBAs using standard-pitch components would not require such tight tolerances and a faster print speed may be possible. Optimal speeds could be adjusted in software. For example, a user could select a "precision print mode" when printing a support block for an application where a PCBA has fine-pitch components or a user could select a "fast print mode" when printing a support block for an application where a PCBA has standard-pitch components.

The 3D printed support block disclosed in this application may additionally have applications in areas beyond screen printing. For example, the 3D printed support block may be used in x-ray machines that are used to inspect PCBA's.

Figure 9A:
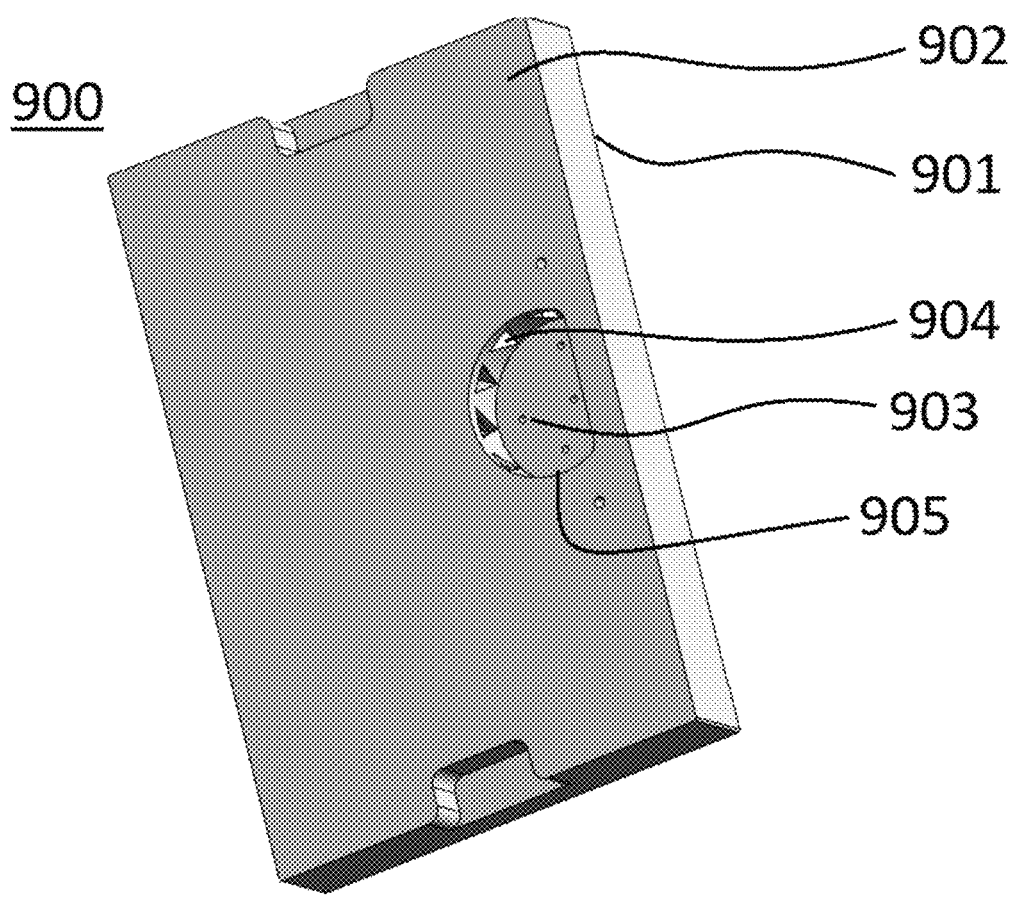
FIG. 9A a bottom perspective view of the support block of FIG. 4.

Turning now to the embodiment shown in FIG. 9A, a bottom view of a support block 900 is shown. The support block 900 has a top side 901 and a bottom side 902. Also shown are vacuum holes 903 and vacuum channels 904. Vacuum connection 905 is also present for connecting a vacuum source to support block 900.

Figure 9B:
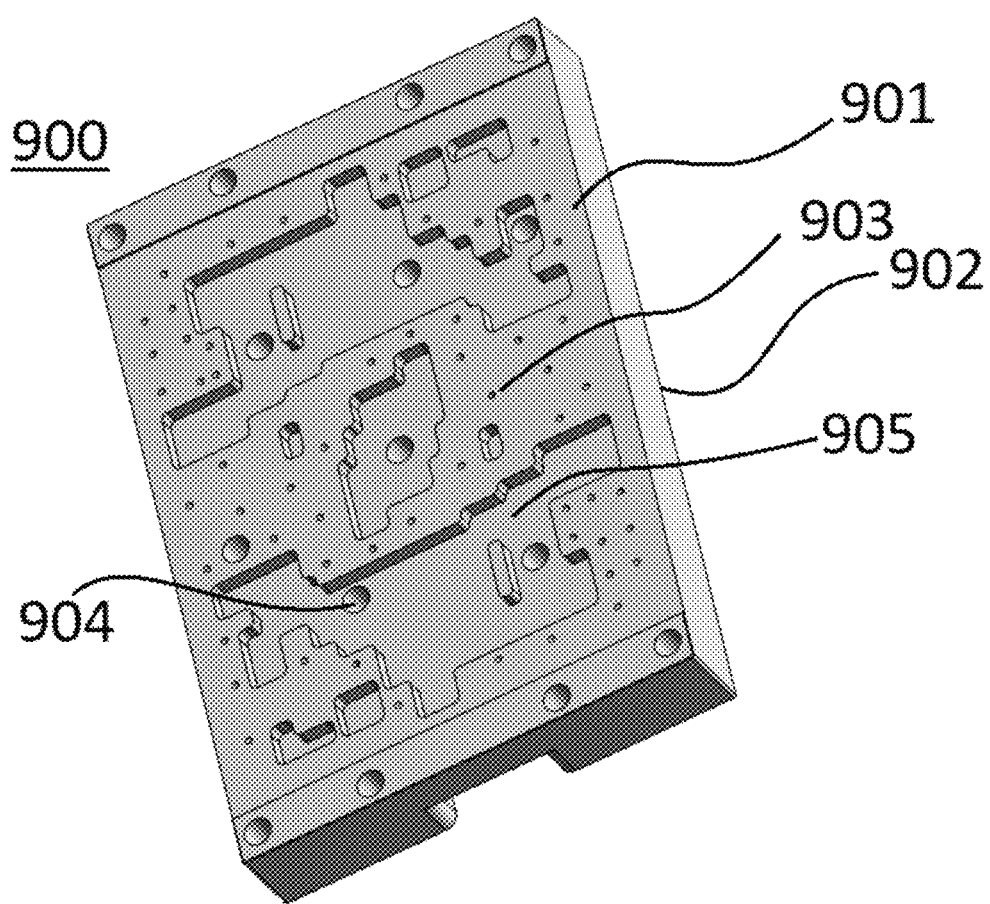
FIG. 9B a top perspective view of the support block of FIG. 9A.

FIG. 9B shows a top view of support block 900. The support block 900 has a top side 901 and a bottom side 902. The support block 900 comprises vacuum holes 903, magnet openings 904, and recessed areas 905. Recessed areas 905 may receive PCBA components, thereby allowing a PCBA to lay flat on the top side 901.

Figure 10:
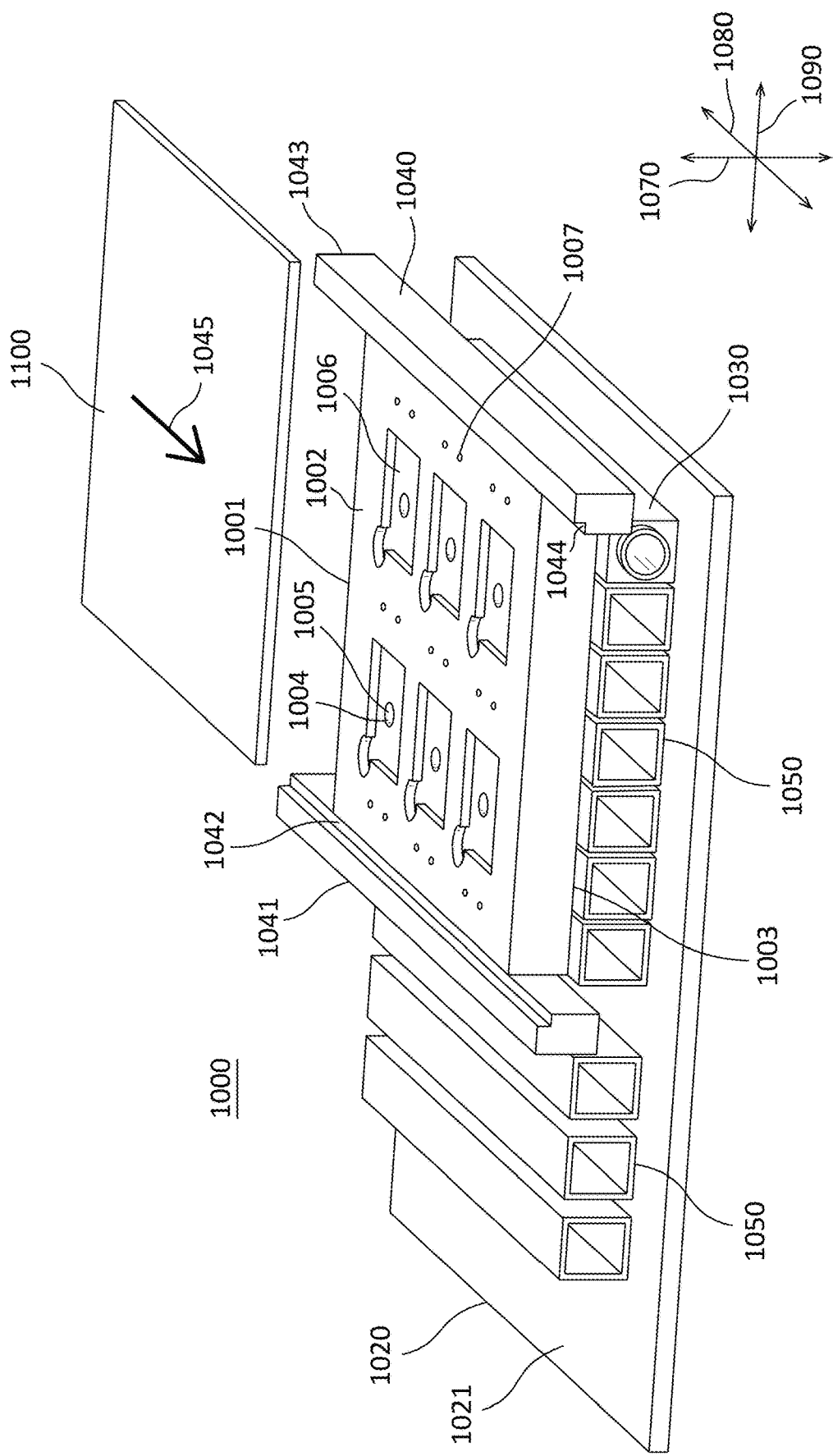
FIG. 10 is a perspective view of a screen printing apparatus including an array of removable support bars according to an embodiment of the invention.

FIG. 10 shows an apparatus 1000 according to an embodiment of the invention. The apparatus 1000 includes a support block 1001, a lift plate 1020, a vacuum block 1030, a conveyor 1040, and at least one support bar 1050. The apparatus 1000 is configured for use during a manufacturing process performed with respect to an article 1100 that is supported on the support block 1001 during the manufacturing process. The article 1100 may be a PCB or a PCBA as previously described herein.

The manufacturing process carried out with respect to the article 1100 may be a screen printing process and hence the apparatus 1000 may be a screen printer or a mechanism of a screen printer. The screen printing process may include solder paste being deposited on a stencil (not shown) overlaying the article 1100 with the stencil having apertures formed therein, wherein a spreading of the solder paste by a squeegee (not shown) or the like results in the solder paste being evenly spread across the stencil and into the corresponding apertures communicating with a surface of the article 1100. The screen printing process includes pressure being applied to the article 1100 in a direction towards the underlying support block 1001, hence it is desirable to include a minimized dimensional tolerance of a top surface 1002 of the support block 1001 on which the article 1100 rests during the screen printing process. In addition to the described screen printing process, the apparatus 1000 may be utilized with respect to any manufacturing process carried out with respect to the article 1100 and the support block 1001 wherein a flatness of the top surface 1002 of the support block 1001 is relevant to optimizing the manufacturing process carried out with respect to the article 1100. Although the PCB or the PCBA are described herein as examples forming the article 1100 for use with the apparatus 1000, the support block 1001 can be provided for other systems such as test fixtures, go-no-go fixtures, wave soldering pallets, and the like.

The support block 1001 may be 3D printed by an additive manufacturing process to cause the support block 1001 to have a single piece design. The single piece design of the support block 1001 is beneficial for minimizing a dimensional tolerance of the support block 1001 and optimizing the flatness thereof, and especially the top surface 1002 of the support block 1001 on which the article 1100 rests during the manufacturing process.

The support block 1001 is illustrated in FIG. 10 as including a bottom surface 1003 arranged parallel to and opposing the top surface 1002 thereof. The support block 1001 further includes at least one magnet opening 1004 with each of the magnet openings 1004 leading to a corresponding magnet channel 1005, at least one recessed area 1006, and at least one vacuum hole 1007. Each of the magnet openings 1004 is shown as being formed within one of the recessed areas 1006, but some or all of the magnet openings 1004 may alternatively be formed in the top surface 1002. Each of the magnet channels 1005 may be configured to receive a magnet (not shown) therein or an insert holder (not shown) encapsulating a magnet therein. Each of the recessed areas 1006 may be configured to receive a component of the article 1100 projecting away from a surface of the article 1100 facing towards the top surface 1002 of the support block 1001, as one example. In the event the article 1100 is a PCB or PCBA, the components may be electrical components such integrated circuits, resistors, capacitors, diodes, and the like. Each of the recessed areas 1006 may accordingly include a perimeter shape and depth corresponding to the shape and depth of the aligned components projecting from the article 1100. Each of the vacuum holes 1007 may be in communication with one or more corresponding vacuum channels (not shown) formed within the support block 1001. Each of the vacuum channels may in turn be in communication with one or more corresponding vacuum connections (not shown) intersecting the bottom surface 1003 of the support block 1001. Each of the vacuum connections may be positioned on the bottom surface 1003 for communication with a corresponding portion of the vacuum block 1030, as explained in greater detail hereinafter when describing the vacuum block 1030 and the operation thereof.

The support block 1001 as illustrated for use with the apparatus 1000 is therefore merely exemplary in nature and may be representative of any of the support blocks 300, 404, 500, 600, 900 disclosed herein as well as any described variations or combinations of the features thereof. The support block 1001 may also be configured for use with any independently provided component such as one of the disclosed insert holders 700, 800 for carrying a magnet received within one of the magnet channels 1005.

The lift plate 1020 includes a support surface 1021 for supporting the vacuum block 1030 and each of the support bars 1050. The lift plate 1020 is configured to translate in a first direction arranged perpendicular to the support surface 1021 as indicated by axis 1070 in FIG. 10. The first direction may be a vertical direction arranged parallel to the direction of gravity. The lift plate 1020 may be operatively coupled to an actuator causing the linear translation of the lift plate 1020 while maintaining the same orientation as illustrated in FIG. 10.

The conveyer 1040 includes a first conveyer element 1041 having a first engaging surface 1042 and an oppositely arranged second conveyer element 1043 having a second engaging surface 1044. The conveyer elements 1041, 1043 and the corresponding engaging surfaces 1042, 1044 extend longitudinally in a second direction arranged parallel to the support surface 1021 of the lift plate 1020 and perpendicular to the first direction. The second direction is indicated by axis 1080 in FIG. 10. The second direction may be a horizontal direction arranged perpendicular to the direction of gravity. The engaging surfaces 1042, 1044 are arranged on a plane arranged parallel to the plane of the support surface 1021 and are configured to support opposing sides of the article 1100. The engaging surfaces 1042, 1044 may be formed by conveyer belts, sliding carriages, or the like configured to selectively translate the article 1100 in the second direction relative to the underlying lift plate 1020 as indicated by arrow 1045 in FIG. 10.

The first conveyer element 1041 and the second conveyer element 1043 are spaced apart from each other with respect to a third direction arranged parallel to the support surface 1021 and perpendicular to each of the first direction and the second direction. The third direction is indicated by axis 1090 in FIG. 10. In an embodiment of the apparatus 1000, the space present between the first conveyer element 1041 and the second conveyer element 1043 with respect to the third direction may be adjustable to accommodate articles 1100 of varying dimensions. For example, the second conveyer element 1043 may remain substantially stationary at a position adjacent the vacuum block 1030 while the first conveyer element 1041 may be configured to translate with respect to the third direction towards or away from the second conveyer element 1043. The spacing between the first conveyer element 1041 and the second conveyer element 1043 may also be selected to be equal to or greater than a dimension of the support block 1001 in the third direction to allow for passage of the support block 1001 between the opposing conveyer elements 1041, 1043 during vertical translation of the lift plate 1020 towards the conveyer elements 1041, 1043 as explained hereinafter.

The vacuum block 1030 is disposed on the support surface 1021 of the lift plate 1020 at a position biased towards the second conveyer element 1043. The vacuum block 1030 is fixed in position on the lift plate 1020 to allow for the support bars 1050 and the support block 1001 to be positioned on the lift plate 1020 relative to the fixed position of the vacuum block 1030.

The vacuum block 1030 includes a top surface 1031 arranged parallel to the support surface 1021 with the top surface 1031 configured to engage a portion of the bottom surface 1003 of the support block 1001 disposed towards the second conveyer element 1043. The top surface 1031 is provided to be flat to properly support the support block 1001 in order to avoid a disorientation or misalignment of the support block 1001 during the manufacturing process such as the described screen printing process. The top surface 1031 is spaced apart from the support surface 1021 by a height dimension of the vacuum block 1030 extending in the first direction.

In the illustrated embodiment, the vacuum block 1030 is substantially rectangular cuboid in shape and extends longitudinally in the second direction. The top surface 1031 thereof similarly extends in the second direction with the top surface 1031 positioned between the first and second conveyer elements 1041, 1043 with respect to the third direction and biased towards the second conveyer element 1043.

Figures 11A, 11B, 11C:
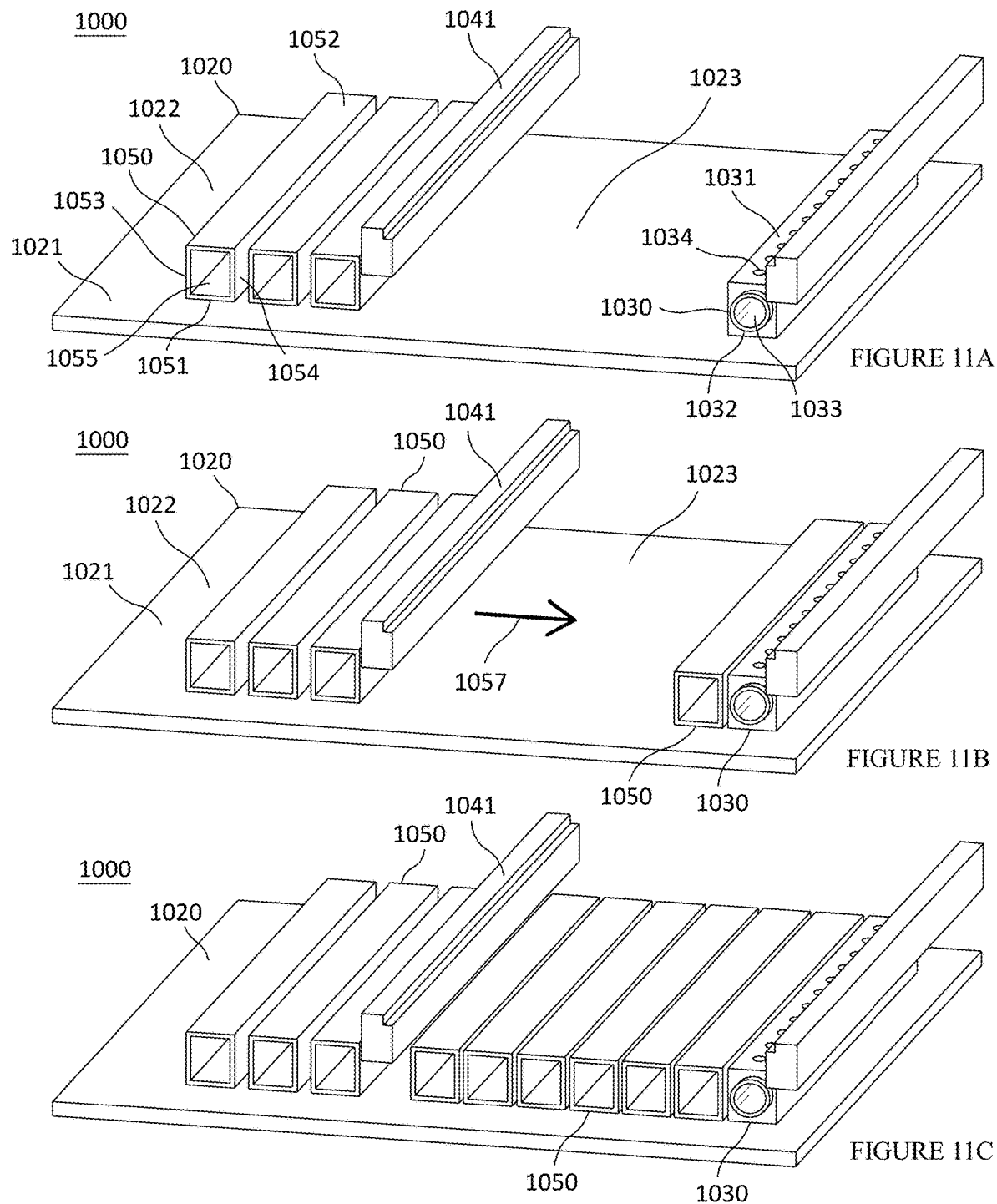
FIG. 11A is a perspective view of the screen printing apparatus prior to the placement of the removable support bars within an active area of a lift plate.
FIG. 11B is a perspective view of the screen printing apparatus following the placement of a first one of the removable support bars within the active area of a lift plate.
FIG. 11C is a perspective view of the screen printing apparatus following the placement of a plurality of the removable support bars within the active area of the lift plate.

The vacuum block 1030 is best shown in FIG. 11A which shows the apparatus 1000 prior to placement of the support block 1001 and the support bars 1050 as utilized during the manufacturing process. The vacuum block 1030 includes a vacuum coupling 1032 leading to a vacuum manifold 1033. The vacuum coupling 1032 fluidly connects the vacuum block 1030 to a vacuum source (not shown) configured to generate a suction pressure within the vacuum manifold 1033. The vacuum manifold 1033 is fluidly coupled to at least one vacuum port 1034 provided in the top surface 1031 of the vacuum block 1030. At least one of the vacuum ports 1034 is configured to be placed in fluid communication with at least one of the vacuum connections formed on the bottom surface 1003 of the support block 1001. In an embodiment of the invention, the support block 1001 may include one elongate vacuum connection formed in the bottom surface 1003 thereof acting as a manifold opening with each of the vacuum ports 1034 fluidly communicating with the single vacuum connection. In other embodiments, the support block 1001 may include multiple vacuum connections with each of the vacuum connections fluidly connected to one or more of the vacuum ports 1034. The vacuum block 1030 is shown as including a plurality of the vacuum ports 1034 arranged in a rectilinear array extending in the second direction, but alternative arrangements of the vacuum ports 1034 may be utilized so long as the vacuum ports 1034 are positioned to correspond to each of the positions of the vacuum connections formed in the support block 1001.

Each of the support bars 1050 includes a bottom surface 1051 configured to rest on the support surface 1021 of the lift plate 1020, a top surface 1052 spaced apart from the support surface 1021, a first side surface 1053 connecting the bottom and top surfaces 1051, 1052 at a first side of the corresponding support bar 1050, and a second side surface 1054 connecting the bottom and top surfaces 1051, 1052 at an opposing second side of the corresponding support bar 1050. Each of the support bars 1050 includes a substantially rectangular cuboid shape with each of the support bars 1050 extending longitudinally in the second direction parallel to the direction of extension of the vacuum block 1030. Each of the support bars 1050 may be hollow with a longitudinally extending opening 1055 formed therethrough from opposing ends of each of the support bars 1050. The hollowness of each of the support bars 1050 may be selected to minimize an amount of material used to form each of the support bars 1050, thereby minimizing a weight and cost of each of the support bars 1050.

In one embodiment, all of the support bars 1050 may be provided to include the same shape and the same dimensions in a manner wherein the support bars 1050 are interchangeable with each other. A length dimension of each of the support bars 1050 may be selected to correspond to a length dimension of the vacuum block 1030 or the support block 1001 as measured in the second direction. The width dimension of each of the support bars 1050 measured between the opposing side surfaces 1053, 1054 may be selected to allow for a desired number of the support bars 1050 to be disposed beneath the support block 1001 and between the opposing conveyer elements 1041, 1043. In some embodiments, at least some of the support bars 1050 may include a different width dimension to allow for a combination of the support bars 1050 to accommodate articles 1100 of varying widths that do not correspond substantially to a given quantity of the uniform support bars 1050.

The height dimension of each of the support bars 1050 is selected to be equal to the height dimension of the vacuum block 1030. Additionally, even if some of the support bars 1050 include different width or length dimensions, all of the support bars 1050 are provided to include the common height dimension. As a result, all of the top surfaces 1052 of the support bars 1050 and the top surface 1031 of the vacuum block 1030 are arranged on a common plane arranged parallel to the support surface 1021 and spaced therefrom by the height dimension of each of the support bars 1050 and the vacuum block 1030. The co-planar arrangement of all of the top surfaces 1031, 1052 provides a flat surface on which the corresponding portions of the bottom surface 1003 of the support block 1001 may rest in order to aid in establishing a flatness of the support block 1001.

Each of the support bars 1050 may be formed from a magnetically attractive material configured to magnetically attract the magnets configured for reception within the magnet channels 1005 of the support block 1001. The magnetically attractive material may be a ferrous material such as steel or various alloys thereof.

The support surface 1021 of the lift plate 1020 is subdivided into a holding area 1022 and an active area 1023. The holding area 1022 is configured to support any of the support bars 1050 that are not instantaneously disposed between the conveyer elements 1041, 1043 at a position suitable for supporting the support block 1001. In contrast, the active area 1023 is configured to support any of the support bars 1050 positioned to cooperate with the vacuum block 1030 for supporting the support block 1001. The active area 1023 is accordingly disposed between the conveyer elements 1041, 1043 with respect to the third direction and beneath the position of the support block 1001 when the manufacturing process is carried out by the apparatus 1000.

As shown in FIGS. 11A-11C, the arrangement of the array of the support bars 1050 suitable for subsequently supporting the support block 1001 may be achieved by first disposing one or more of the support bars 1050 on the holding area 1022. The lift plate 1020 is moved with respect to the first direction to a position wherein a space between the support surface 1021 and the first conveyer element 1041 is greater than a height dimension of each of the support bars 1050. Each of the support bars 1050 is then able to be translated from the holding area 1022 to the active area 1023 by sliding each of the respective support bars 1050 under the first conveyer element 1041 and towards the vacuum block 1030 with respect to the third direction as indicated by arrow 1057 in FIG. 11B. This process is repeated until a desired quantity of the support bars 1050 is positioned within the active area 1023 as shown in FIG. 11C. The vacuum block 1030 and the desired quantity of the support bars 1050 are then positioned to provide a flat series of surfaces on which the bottom surface 1003 of the support block 1001 may rest prior to initiation of the manufacturing process.

Although not illustrated, the support bars 1050 and the support surface 1021 of the lift plate 1020 may include complimentary structures extending in the third direction to allow for a desired placement and then sliding of the support bars 1050 to the position suitable for reception of the support block 1001 thereon. For example, the support surface 1021 and the bottom surface 1051 of each of the support bars 1050 may include complimentary rails, grooves, indentations, projections, or other sliding connection features that prescribe a sliding of each of the support bars 1050 from the holding area 1022 to the active area 1023 while maintaining a desired orientation and relative positioning of each of the support bars 1050.

Figure 12A:
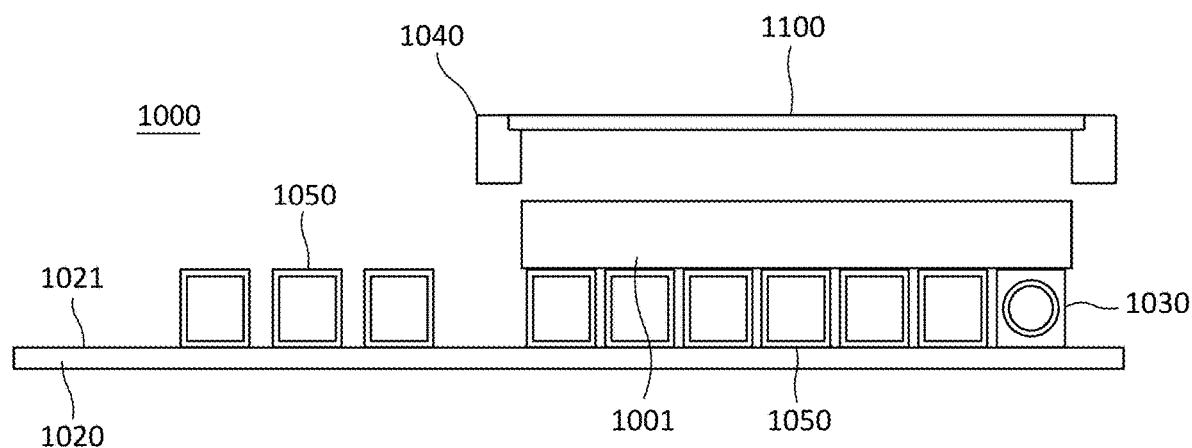
FIG. 12A is a front elevational view of the screen printing apparatus when the lift plate is in a lowered position.
Figure 12B:
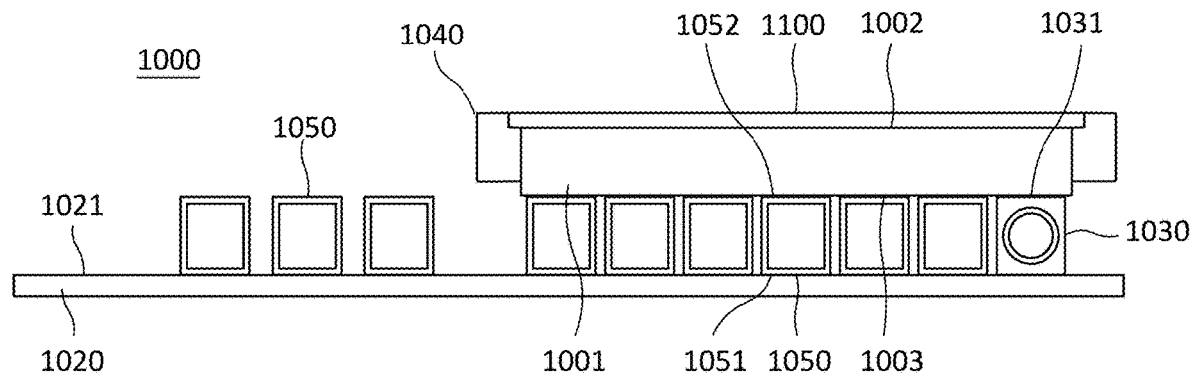
FIG. 12B is a front elevational view of the screen printing apparatus when the lift plate is in a raised position.

FIGS. 12A and 12B show a method of operation of the apparatus 1000 following the placement of a desired quantity of the support bars 1050 within the active area 1023 as well as the placement of the support block 1001 on the cooperating support bars 1050 and vacuum block 1030. The support block 1001 is positioned on the vacuum block 1030 to allow for any vacuum connections present on the bottom surface 1003 of the support block 1001 to fluidly communicate with the corresponding vacuum ports 1034 present on the top surface 1031 of the vacuum block 1030. The article 1100 is also positioned with respect to the second direction on the engaging surfaces 1042, 1044 of the conveyer 1040 above the support bars 1050, the vacuum block 1030, and the support block 1001.

FIG. 12A shows the lift plate 1020 when in a lowered position with the support block 1001 positioned below the conveyer 1040. The article 1100 may be conveyed to the position above the support block 1001 when the lift plate 1020 is in the lowered position. FIG. 12B shows the lift plate 1020 after having been translated upwardly with respect to the first direction to a raised position with the top surface 1002 of the support block 1001 engaging an underside of the article 1100. Any components projecting from the underside of the article 1100 are received within the recessed areas 1006 formed in the support block 1001.

Any magnets received within the magnet channels 1005 of the support block 1001 are magnetically attracted to the underlying support bars 1050 to aid in flattening the support block 1001. For example, any warping of the support block 1001 may be minimized to promote the flatness of the top surface 1002 and the bottom surface 1003 of the support block 1001. The vacuum manifold 1033 is also placed in communication with the vacuum source to draw air towards the vacuum source through the vacuum holes 1007, vacuum channels, vacuum connections, and vacuum ports 1034, which in turn aids in securing the article 1100 to the top surface 1002 of the support block 1001 during the manufacturing process. The manufacturing process such as the described screen printing process is then able to be carried out on the exposed surface of the article 1100 while maintaining the flatness specifications of the article 1100.

The apparatus 1000 provides numerous advantageous features. The support bars 1050 are easily manufactured and are low cost due to the minimization of material utilized in forming the support bars 1050. The modular configuration of the support bars 1050 also allows for a customization of the array of the support bars 1050 in order to accommodate articles 1100 of differing dimensions and configurations as fewer or more of the support bars 1050 may be easily slid into position within the active area 1023 of the lift plate 1020. The cooperation of the support bars 1050 and the vacuum block 1030 provides a relatively large flat area onto which the support block 1001 may be reliably mounted. The magnetic material used to form the support bars 1050 allows for the support bars 1050 to aid in flattening the support block 1001 via the magnetic attraction present between the support bars 1050 and any magnets disposed within the support block 1001. The manifold configuration of the vacuum block 1030 allows for a better distribution of the suction pressure to any vacuum connections formed within the support block 1001, which in turn promotes an equalization of the suction generated at each of the vacuum holes 1007. In view of each of the above advantages, the article 1100 is able to be flattened relative to the support block 1001 within dimensional tolerances to ensure that the manufacturing process is carried out in a desired manner, such as ensuring that a screen printing process is carried out evenly across the exposed surface of a PCB or a PCBA acting as the article 1100.

In the foregoing detailed description, it may be that various features are grouped together in individual embodiments for the purpose of brevity in the disclosure. This method of disclosure is not to be interpreted as reflecting an intention that any subsequently claimed embodiments require more features than are expressly recited.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

What is claimed is:

1. A 3D printed support block comprising:
a bottom surface having a vacuum connection;
a top surface having at least one vacuum hole;
at least one recessed surface that is offset from the top surface;
at least one vacuum channel extending from the vacuum connection to the at least one vacuum hole, and
a magnet channel extending from the top surface or the at least one recessed surface towards the bottom surface.

2. The 3D printed support block of claim 1, wherein the 3D printed support block is produced from a continuous piece of extruded polymer.

3. The 3D printed support block of claim 1, wherein at least a portion of the 3D printed support block is produced from an electrostatic-discharge protected, polyethylene terephthalate glycol.

4. The 3D printed support block of claim 3, wherein a portion of the 3D printed support block is produced from a thermoplastic elastomer.

5. The 3D printed support block of claim 3, wherein a portion of the 3D printed support block is produced from styrene-ethylene-butylene-styrene.

6. The 3D printed support block of claim 1, wherein the magnet channel forms an opening and an insert holder is disposed in the opening.

7. The 3D printed support block of claim 1, wherein at least one magnet is disposed within the magnet channel.

8. The 3D printed support block of claim 1, wherein the 3D printed support block is mechanically or magnetically fastened to at least one parallel support block positioned adjacent the 3D printed support block.

9. The 3D printed support block of claim 1, wherein a first material is deposited to form a portion of the 3D printed support block and a second material is deposited circumferentially around the at least one vacuum hole.

10. A method for producing a 3D printed support block, the method comprising:
  3D printing a support block, wherein the support block comprises:
    a bottom surface having a vacuum connection;
    a top surface having at least one vacuum hole;
    at least one recessed surface that is offset from the top surface; and
    at least one vacuum channel extending from the vacuum connection to the at least one vacuum hole, wherein the 3D printed support block further comprises magnet channels that extend from the top surface or the at least one recessed surface towards the bottom surface.

11. The method of claim 10, wherein the 3D printed support block is printed in a clean room, as defined by ISO 14644-1 Cleanroom Standards.

12. The method of claim 10, wherein a feedstock material for the 3D printing is produced from liquefied recycled 3D printed support blocks.

13. The method of claim 10, wherein the 3D printed support block holds a printed circuit board or printed circuit board assembly in a screen printer.

14. The method of claim 10, wherein the 3D printed support block holds a printed circuit board or printed circuit board assembly in an x-ray inspection machine.

15. The 3D printed support block of claim 10, wherein the magnet channels form an opening formed and an insert holder is disposed in the opening.

16. The 3D printed support block of claim 15, wherein the support block is disposed in one of a screen printed circuit board assembly, a test fixture, a go-no-go fixture, or a wave soldering pallet.

17. The 3D printed support block of claim 10, wherein at least one magnet is positioned within each of the magnet channels.

18. The 3D printed support block of claim 10, wherein the top surface is produced from a first material and a remainder of the 3D printed support block is produced from a second material.

* * * * *